(12) United States Patent
Yoshida

(10) Patent No.: US 8,530,986 B2
(45) Date of Patent: Sep. 10, 2013

(54) MANUFACTURING METHOD OF ELECTRONIC DEVICE PACKAGE, ELECTRONIC DEVICE PACKAGE, AND OSCILLATOR

(75) Inventor: Yoshifumi Yoshida, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 13/070,995

(22) Filed: Mar. 24, 2011

(65) Prior Publication Data

US 2011/0233694 A1 Sep. 29, 2011

(30) Foreign Application Priority Data

Mar. 26, 2010 (JP) ................................. 2010-073340

(51) Int. Cl.
*H01L 29/84* (2006.01)
(52) U.S. Cl.
USPC .................................. 257/418; 257/E21.499
(58) Field of Classification Search
USPC .................. 257/418, 699, 703, 729, E21.499, 257/E29.324; 438/51
See application file for complete search history.

(56) References Cited

U.S. PATENT DOCUMENTS

| | | | | |
|---|---|---|---|---|
| 8,049,326 B2* | 11/2011 | Najafi et al. | ................... | 257/698 |
| 2010/0047588 A1* | 2/2010 | Hata et al. | ..................... | 428/428 |
| 2010/0123369 A1* | 5/2010 | Ono et al. | ...................... | 310/348 |
| 2010/0201221 A1* | 8/2010 | Inoue et al. | ................... | 310/312 |
| 2011/0018398 A1* | 1/2011 | Fukuda | ......................... | 310/344 |
| 2011/0050043 A1* | 3/2011 | Sugiyama | ..................... | 310/344 |
| 2011/0050046 A1* | 3/2011 | Onitsuka et al. | ............. | 310/344 |
| 2011/0114840 A1* | 5/2011 | Yamazaki et al. | ......... | 250/338.1 |
| 2011/0169584 A1* | 7/2011 | Fukuda | ......................... | 331/158 |

FOREIGN PATENT DOCUMENTS

JP 09-002845 A 1/1997
WO WO 2010010721 A1 * 1/2010

* cited by examiner

*Primary Examiner* — William D Coleman
*Assistant Examiner* — Christine Enad
(74) *Attorney, Agent, or Firm* — Brinks Hofer Gilson & Lione

(57) ABSTRACT

A manufacturing method of an electronic device package includes: forming concave portions that later form the cavities in one surface of a cover substrate; forming a first metal film on the cover substrate on a surface opposite to the surface in which the concave portions are formed; forming a second metal film on the cover substrate on the surface in which the concave portions are formed; bonding a base substrate and the cover substrate together via the second metal film. It thus becomes possible to provide an electronic device package in which the base substrate and the cover substrate are boned together via the metal film in a stable manner by minimizing warping of the substrate even when the substrate is made thinner.

11 Claims, 7 Drawing Sheets

MANUFACTURING METHOD OF ELECTRONIC DEVICE PACKAGE, ELECTRONIC DEVICE PACKAGE, AND OSCILLATOR

RELATED APPLICATIONS

This application claims priority under 35 U.S.C. §119 to Japanese Patent Application No. 2010-073340 filed on Mar. 26, 2010, the entire content of which is hereby incorporated by reference.

BACKGROUND OF THE INVENTION

1. Field of the Invention

The present invention relates to a package for a surface mount device (SMD) in which an electronic device is encapsulated in a cavity formed between two substrates bonded together, and more particularly, to a structure to bond two substrates.

2. Background Art

Recently, electronic devices using a compact surface mount device package are employed often in mobile phones and personal digital assistants. Of these electronic devices, many components, such as a transducer, an MEMS, a gyrosensor, and an acceleration sensor, require a package of a hollow cavity structure. A structure in which a base substrate and a cover substrate are boned together via a metal film is known as a package of the hollow cavity structure. Also, eutectic bonding, seam bonding, and anodic bonding are known as a bonding method. Details are described, for example, in JP-A-09-002845.

A manufacturing method of a package in the related in which a base substrate and a cover substrate are bonded together via a metal film will now be described. In particular, a description will be given to a manufacturing method by which a plurality of package elements are formed in array on a single sheet of base substrate and after a cover substrate is boned to the base substrate, the bonded substrates are divided into individual packages.

As are shown in FIG. 7A through FIG. 7E, an electronic device package in the related art includes an electronic device 47, a plate-shaped base substrate 41, a cover substrate 42 provided with a concave portion, and a metal film 49, which is a bonding film to bond the base substrate 41 and the cover substrate 42 together. Because the cover substrate 42 is provided with a concave portion, a cavity 46 is formed by sealing the base substrate 41 with the cover substrate 42. The electronic device 47 is accommodated in the cavity 46.

The base substrate 41 is formed of an insulator, a semiconductor, or metal and formed in a plate shape. Wires 43 used to mount the electronic devices 47 are formed on the surface of the base substrate 41 in a number according to the number of the electronic devices 47 to be mounted. Outside electrodes 45 are formed on the back surface of the base substrate 41 in a corresponding manner to the wires 43. In order to connect the wires 43 on the front surface of the base substrate 41 and the corresponding outside electrodes 45 on the back surface, through-holes are formed at arbitrary portions of the packages and feed-through electrodes 44 are formed to fill the respective through-holes. The wires 43 and the outside electrodes 45 are thus connected via the feed-through electrodes 44.

The cover substrate 42 is formed of an insulator, a semiconductor, or metal and formed to have concave portions. When the cavities 46 are formed as the base substrate 41 and the cover substrate 42 are bonded together, the metal film 49 is formed as the bonding film in a portion where the base substrate 41 and the cover substrate 42 come into contact with each other. Basically, it is sufficient to form the metal film 49 only on the portion where the base substrate 41 and the cover substrate 42 come into contact with each other. However, by taking simplification of the steps into account, as is shown in FIG. 7B, the metal film 49 is formed entirely on one surface of the cover substrate 42.

The manufacturing method will now be described. A plurality of concave cavities 46 are formed in a wafer of cover substrate 42 so that a plurality of electronic devices 47 can be mounted thereon (FIG. 7A). Thereafter, the metal film 49 as a bonding film is formed on one surface of the cover substrate 42 (FIG. 7B). Aluminum, chrome, silicon, and copper are suitable as the metal film 49. The wires 43 used to mount a plurality of the electronic devices 47 on a wafer of base substrate 41, the outside electrodes 45, and the feed-through electrodes 44 are formed (FIG. 7C). Subsequently, the electronic devices 47 are mounted on the base substrate 41 and the electronic devices 47 and the wires 43 are connected with wires 48 by wire bonding (FIG. 7D).

The base substrate 41 and the cover substrate 42 are aligned and superimposed, and then bonded together. When bonded together, as is shown in FIG. 7E, the base substrate 41 and the cover substrate 42 aligned with each other are sandwiched by substrates 50 and 51 serving as heaters and also as electrodes. A positive electrode probe 52 is set so as to come into contact with the metal film 49 and temperatures of the substrates 50 and 51 serving as heaters and also as electrodes are raised. A voltage is then applied between the positive electrode probe 52 and the substrate 50 serving as a heater and also as an electrode. Consequently, the base substrate 41 and the cover substrate 42 are bonded together via the metal film 49. Thereafter, package elements are cut off individually using a dicing apparatus or the like. Individual electronic device packages are thus completed.

The manufacturing method of the electronic device package in the related art, however, has problems as follows. Firstly, because a plurality of concave portions that later form the cavities 46 are formed in one surface of the cover substrate 42, when the cover substrate 42 is made thinner, shapes of one surface and the other surface of the cover substrate 42 differ from each other. This poses a problem that the cover substrate 42 warps considerably. To eliminate this problem, a countermeasure to suppress warping is taken by increasing a film thickness of the metal film 49 formed on the cover substrate 42 on the surface in which the concave portions are formed. However, when the metal film 49 becomes thicker, there arises another problem that bonding strength between the metal film 49 and the base substrate 41 becomes lower.

SUMMARY OF THE INVENTION

The invention was devised in view of the foregoing and has an object to provide an electronic device package in which a base substrate and a cover substrate are bonded together via a metal film in a stable manner by minimizing warping of the substrate even when the substrate whose one surface and other surface have different shapes is made thinner.

A manufacturing method of an electronic device package according to an aspect of the invention is a manufacturing method of an electronic device package including a base substrate, a cover substrate bonded to the base substrate while being opposed to the base substrate, and electronic devices respectively accommodated in a plurality of cavities formed between the base substrate and the cover substrate and mounted on the base substrate. The manufacturing method includes: forming concave portions that later form the cavities in one surface of the cover substrate; forming a first metal film on the other surface of the cover substrate; forming a second metal film on the one surface of the cover substrate; and bonding the base substrate and the cover substrate together via the second metal film.

According to the manufacturing method of the electronic device package of the invention, the metal film is also formed on the cover substrate on the surface opposite to the surface in which the concave portions are formed. Accordingly, even when the cover substrate becomes extremely thin, this metal film plays a role of preventing warping of the cover substrate. Hence, there can be achieved an advantage that warping of the cover substrate can be suppressed to the least extent when the base substrate and the cover substrate are bonded together. Further, because the metal film is formed on the cover substrate on the surface opposite to the surface bonded to the base substrate, there can be achieved another advantage that a product identification number can be inscribed on this metal film. In a case where the cover substrate is an insulator, it has been quite difficult to inscribe the product identification number on the cover substrate on the surface opposite to the surface bonded to the base substrate.

DETAILED DESCRIPTION OF THE PREFERRED EMBODIMENTS

Figure 1:
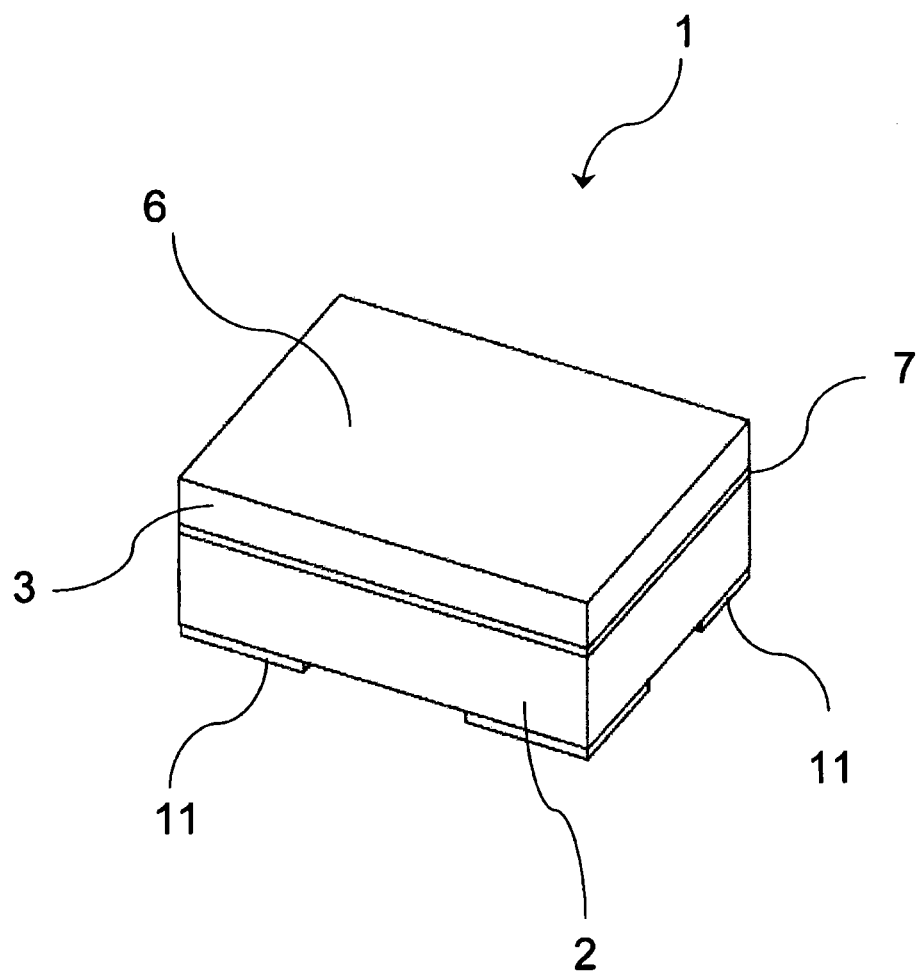
FIG. 1 is a perspective view showing one embodiment of an electronic device package of the invention.
Figure 2:
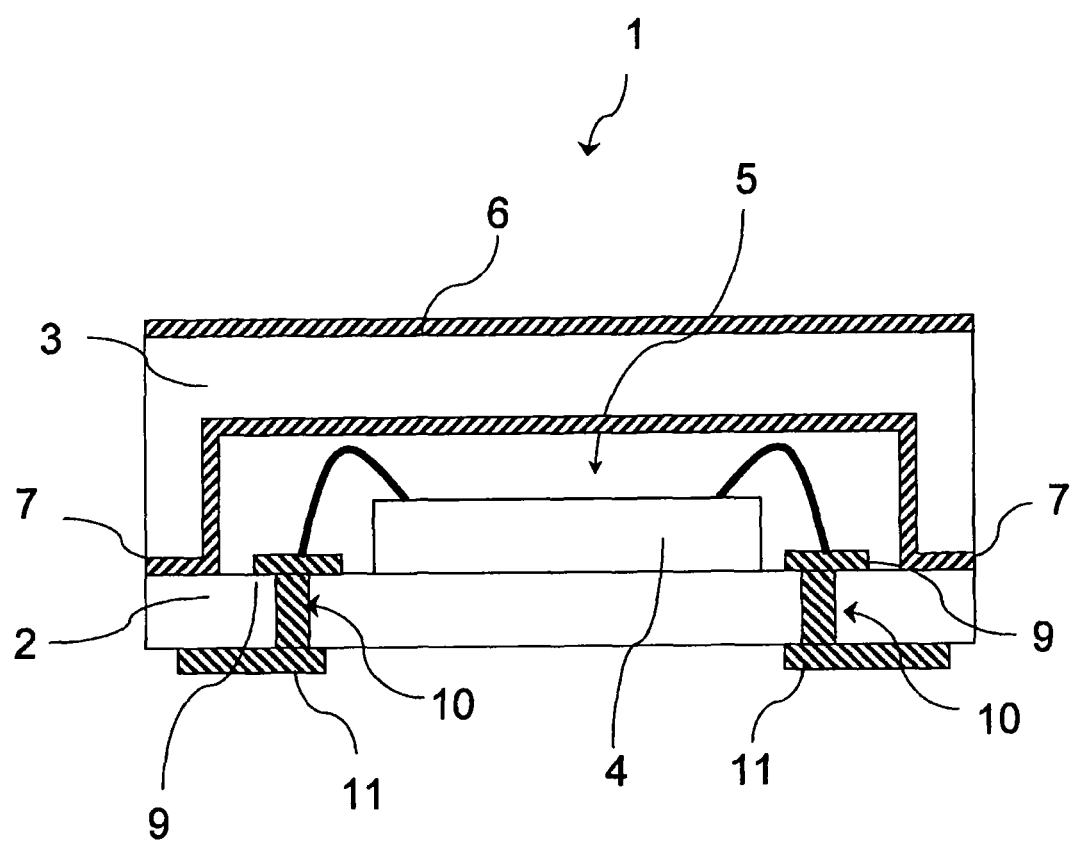
FIG. 2 is a cross section showing one embodiment of the electronic device package of the invention.
Figure 3:
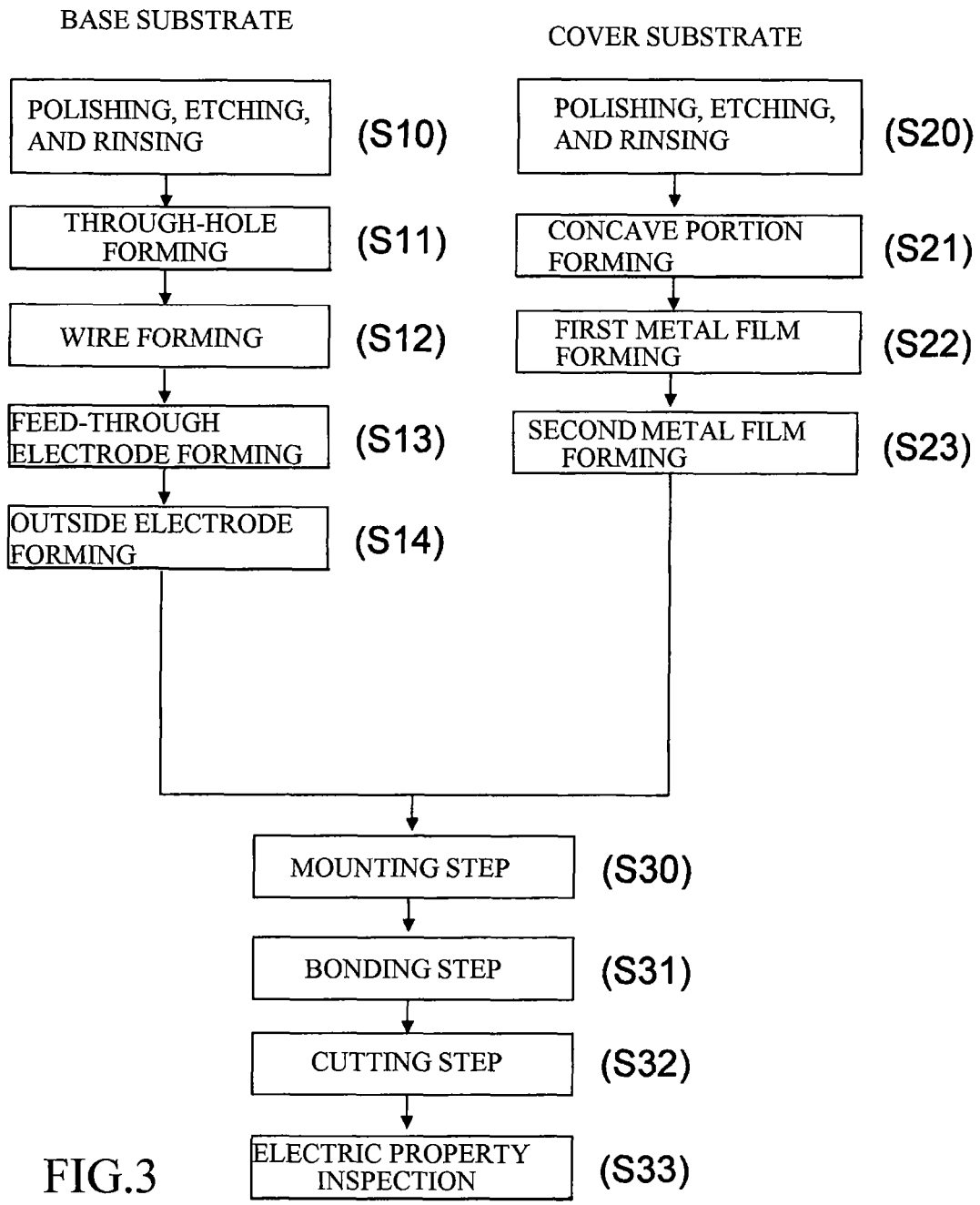
FIG. 3 is a flowchart depicting one embodiment of a manufacturing method of the electronic device package of the invention.

Hereinafter, one embodiment of the invention will be described with reference to FIG. 1 through FIG. 5B. As are shown in FIG. 1 and FIG. 2, an electronic device package 1 of this embodiment is a surface mount device package including a base substrate 2 and a cover substrate 3 laminated in two layers in a box shape and an electronic device 4 accommodated in a cavity 5 formed inside the box. The electronic device 4 means an LSI, an MEMS, a sensor, and a piezoelectric transducer, or a complex thereof.

Both the base substrate 2 and the cover substrate 3 are formed of an insulator, a semiconductor, metal, or a combination thereof and both are an insulator made, for example, of soda glass in this embodiment. In the case shown in FIG. 1 and FIG. 2, a rectangular concave portion that later forms a cavity 5 in which to accommodate the electronic device 4 is formed in the cover substrate 3 on the surface to which the base substrate 2 is bonded and the base substrate 2 is formed in a plate shape. The concave portion 5 is a concave portion that later forms the cavity 5 in which to accommodate the electronic device 4 when the both substrates 2 and 3 are superimposed. The cover substrate 3 is bonded to the base substrate 2 via a metal film 7, which is a bonding film, in a state where the concave portion 5 is opposed to the base substrate 2.

As is shown in FIG. 2, feed-through electrodes 10 are formed in the base substrate 2 to electrically connect the electronic device 4 and outside electrodes 11. Through-holes in which to insert the feed-through electrodes 10 are formed to open within the cavity 5. With reference to FIG. 2, descriptions will be given to through-holes that penetrate straight through the base substrate 2 while maintaining substantially a constant diameter. The invention, however, is not limited to this case. For example, through-holes may be tapered by gradually increasing or decreasing the diameter toward the bottom surface of the base substrate 2. In any case, it is sufficient that through-holes penetrate through the base substrate 2.

The feed-through electrodes 10 are formed in the respective through-holes so as to fill the through-holes. The feed-through electrodes 10 play not only a role of maintaining the interior of the cavity 5 hermetically by completely closing the through-holes but also a role of bringing the outside electrodes 11 and the electric device 4 into conduction. A clearance between the through-hole and the feed-through electrode 10 is completely filled using a material, such as an inorganic material or an organic material, having a thermal expansion coefficient adjusted to that of the base substrate 2.

A manufacturing method of an electronic device package according to one embodiment of the invention will now be described with reference to the flowchart of FIG. 3 and FIG. 4A through FIG. 5B.

Initially, the base substrate 2 is obtained by polishing and etching a wafer of insulating substrate until it reaches a target thickness followed by rinsing (S10). Subsequently, through-holes are formed in the base substrate 2 (S11). The through-holes can be formed by any appropriate method and etching by photo-lithography and press working are applicable.

Wires 9 used to mount the electronic devices 4 on the base substrate 2 are formed (S12). Subsequently, the feed-through electrodes 10 are formed in the through-holes formed in the base substrate 2 (S13). Further, the outside electrodes 11 are formed on the base substrate 2 on the surface opposite to the surface on which the wires 9 are formed (S14). FIG. 4E shows the base substrate 2 in a state where the outside electrodes 11 have been formed.

Figure 4A:
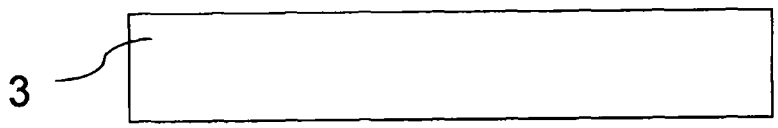
FIG. 4A through FIG. 4F are cross sections of a flowchart depicting one embodiment of the manufacturing method of the electronic device package of the invention.
Figure 4B:
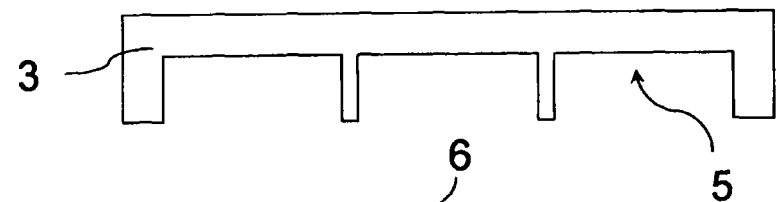
Figure 4C:
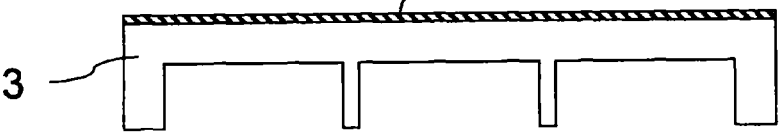

Meanwhile, as is shown in FIG. 4A, the cover substrate 3 is obtained by polishing and etching a wafer of insulating substrate until it reaches a target thickness followed by rinsing (S20). Subsequently, as is shown in FIG. 4B, concave portions that later form the cavities 5 are formed in the cover substrate 3 of a plate shape (S21). The concave portions can be formed by any appropriate method and etching by photo-lithography and press working are applicable. Subsequently, as is shown in FIG. 4C, a first metal film 6 to prevent warping of a wafer is formed on the cover substrate 3 on the entire surface opposite to the surface in which the concave portions are formed (S22). The first metal film 6 is formed using methods, such as vapor deposition, sputtering, and CVD. For the first metal film 6, a material having a smaller linear expansion coefficient than a material used for the cover substrate 3 is used. For example, in a case where soda glass is used for the cover substrate 3, Si, Cr, W, or a combination thereof is used for the first metal film 6, and a thickness thereof is set to a range of 200 angstroms to 2000 angstroms. Soda glass has a linear expansion coefficient of 9 to $10 \times 10^{-6}/°$ C. whereas Si has a linear expansion coefficient of 2.8 to $7.3 \times 10^{-6}/°$ C., Cr has a linear expansion coefficient of $6.2 \times 10^{-6}/°$ C., and W has a linear expansion coefficient of $4.3 \times 10^{-6}/°$ C.

Figure 4D:
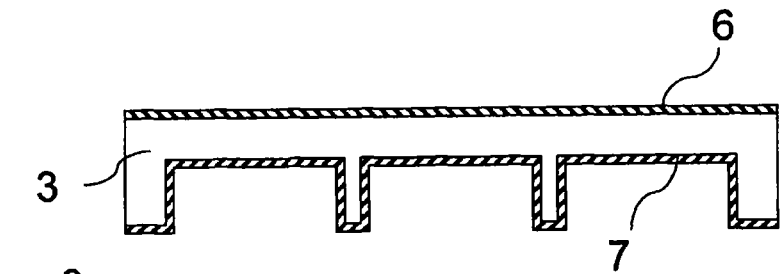
Figure 4E:
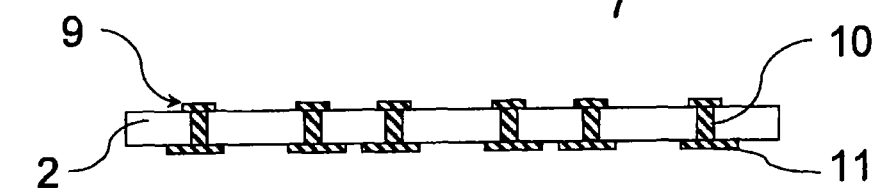

Subsequently, as is shown in FIG. 4D, a second metal film 7 as a bonding film is formed on the cover substrate 3 on the entire surface in which the concave portions are formed (S23). As with the first metal film 6, the second metal film 7 is formed using methods, such as vapor deposition, sputtering, and CVD. A material having a larger linear expansion coefficient than a material used for the cover substrate 3 is used for the second metal film 7 whenever possible. For example, in a case where soda glass is used for the cover substrate 3, Al, Ni, Au—Sn, or Cu is used for the second metal film 7 and a thickness thereof is set to a range of 200 angstroms to 2000 angstroms. However, a material of the second metal film 7 is not necessarily limited to a material having a larger linear expansion coefficient than a material used for the cover substrate 3 and Si, Cr, or W may be used in a case where the cover substrate 3 is made of soda glass. Al has a linear expansion coefficient of $23.9 \times 10^{-6}/°$ C., Ni has a linear expansion coefficient of $13 \times 10^{-6}/°$ C., Au has a linear expansion coefficient of $14.2 \times 10^{-6}/°$ C., Sn has a linear expansion coefficient of $23 \times 10^{-6}/°$ C., and Cu has a linear expansion coefficient of $13 \times 10^{-6}/°$ C. Herein, a priority is placed on a bonding method of the cover substrate 3 and the base substrate 2 when selecting a material of the second metal film 7 formed on the cover substrate 3 on the surface in which the concave portions are formed. Assume that the second metal film 7 has a smaller linear expansion coefficient than a material used for the cover substrate 3, then warping of the cover substrate 3 as a wafer is reduced by increasing a thickness of the first metal film 6 formed on the cover substrate 3 on the surface opposite to the surface in which the concave portions are formed.

Figure 4F:
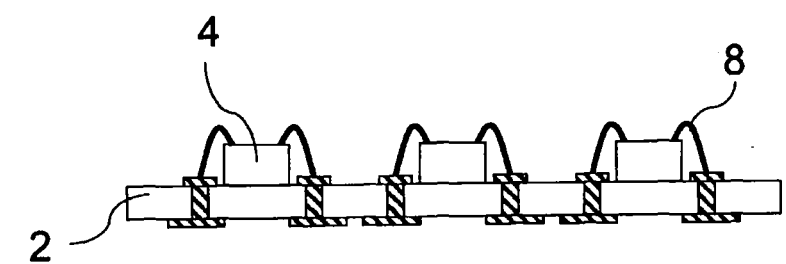

Subsequently, as is shown in FIG. 4F, the electronic devices 4 are mounted on the base substrate 2 (S30). FIG. 4F shows a case where the wires 9 and the electronic devices 4 are connected by wire bonding using wires 8. The invention, however, is not limited to this connection method. As long as electric conduction is ensured, any connection method, such as flip chip bonding and solder bonding, is applicable.

The film thickness of the metal films 6 and 7 is limited to the range of 200 angstroms to 2000 angstroms because of a relation with stability in film formation and bonding strength. When the film thickness is 200 angstroms or less, adhesion strength between the material of the cover substrate 3 and the metal films 6 and 7 is weak. Hence, in order to ensure bonding strength, a film thickness of 200 angstroms or more is necessary. Meanwhile, when the film thickness is 2000 angstroms or more, bonding strength between the base substrate 2 and the cover substrate 3 becomes dependent on an intermolecular bonding force of the film and the bonding strength is lowered.

Subsequently, the base substrate 2 on which are mounted the electronic devices 4 and the cover substrate 3 on which is formed the first metal film 6 are bonded together via the second metal film 7 (S31). In the case shown in FIG. 4A through FIG. 5B, the base substrate 2 is formed in an adequate size to be superimposed on the cover substrate 3.

Figure 5A:
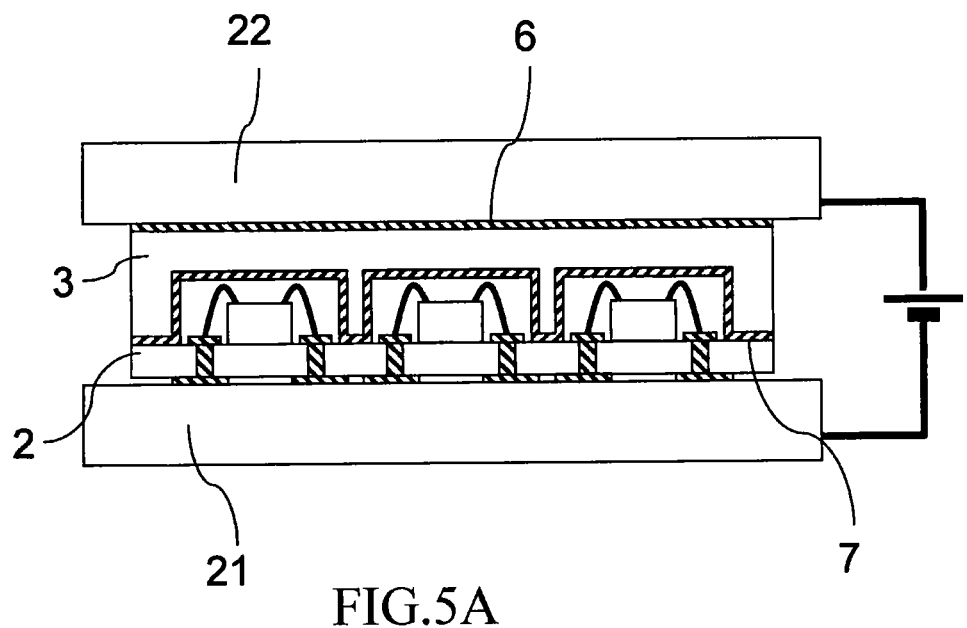
FIG. 5A and FIG. 5B are cross sections of the flowchart depicting one embodiment of the manufacturing method of the electronic device package of the invention.

The bonding method of the base substrate 2 and the cover substrate 3 is selected according to materials forming the respective base substrate 2 and cover substrate 3 and the type of the second metal film 7. For example, in a case where both the base substrate 2 and the cover substrate 3 are made of soda glass, anodic bonding is suitable as the bonding method. FIG. 5A shows a case where the base substrate 2 and the cover substrate 3 are bonded together by anodic bonding. When anodic bonding is performed, the cover substrate 3 and the base substrate 2 are aligned and superimposed first. Subsequently, a negative electrode plate 21 made of carbon or the like is brought into contact with the base substrate 2 on the entire surface opposite to the surface bonded to the cover substrate 3. A positive electrode plate 22 made of carbon or the like is brought into contact with the cover substrate 3 on the entire surface opposite to the surface bonded to the base substrate 2. Further, a certain load is applied between the positive electrode plate 22 and the negative electrode plate 21. In this state, the positive electrode plate 22, the negative electrode plate 21, the base substrate 2, and the cover substrate 3 are heated to 200 to 300° C. by a heater or the like and a voltage of 500 to 1000 V is applied between the positive electrode plate 22 and the negative electrode plate 21. The base substrate 2 and the cover substrate 3 are thus bonded together by anodic bonding.

Figure 5B:
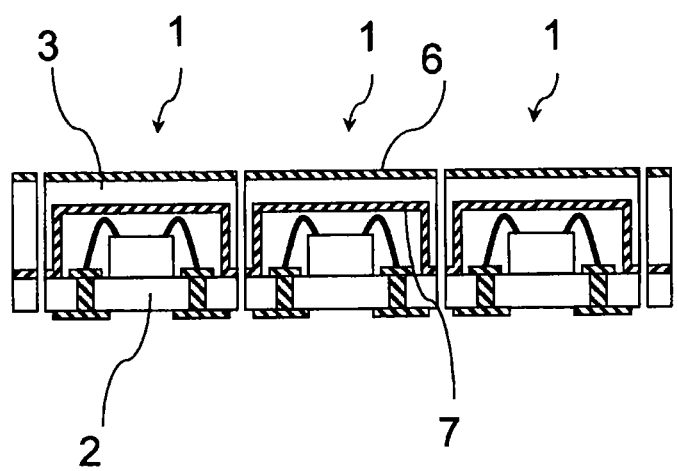

In the state shown in FIG. 5A, a plurality of electronic device package elements are present in a single wafer obtained by bonding a wafer of base substrate 2 and a wafer of cover substrate 3. Accordingly, as is shown in FIG. 5B, the electronic device packages 1 are cut off individually using a dicing saw or a wire saw (S32). FIG. 2 shows a cross section of one individually cut-off electronic device package 1. Thereafter, the electronic device package 1 is completed by conducting an inspection on the internal electric property (S33).

An advantage of bonding the base substrate 2 and the cover substrate 3 together by anodic bonding will now be described. In a case where a ceramic substrate is used as the base substrate, it is necessary to bond a cover for each individual electronic device. Accordingly, a large pressure is applied to the base substrate when the cover is bonded to the base substrate. When the width of the bonding surface is narrow, the bonding surface cannot withstand the pressure. This causes a problem that cracking or chipping occurs. By contrast, because the electronic device package 1 of this embodiment uses anodic bonding to bond the base substrate 2 and the cover substrate 3 together, a plurality of the electronic devices 4 can be mounted simultaneously. Accordingly, a pressure applied to the base substrate per package at the time of bonding becomes small and even when the bonding surface is small, no cracking or chipping occurs. Anodic bonding is therefore extremely effective in manufacturing a compact package.

It should be appreciated that the scope of the invention is not limited to the embodiment described above and various modifications can be made without deviating from the scope of the invention. The embodiment above has described a case where both the base substrate 2 and the cover substrate 3 are made of soda glass and the base substrate 2 and the cover substrate 3 are bonded together by anodic bonding. The invention, however, is not limited to this case. For example, the base substrate 2 and the cover substrate 3 may be bonded together via the metal film 7 by welding or by eutectic bonding.

Figure 6:
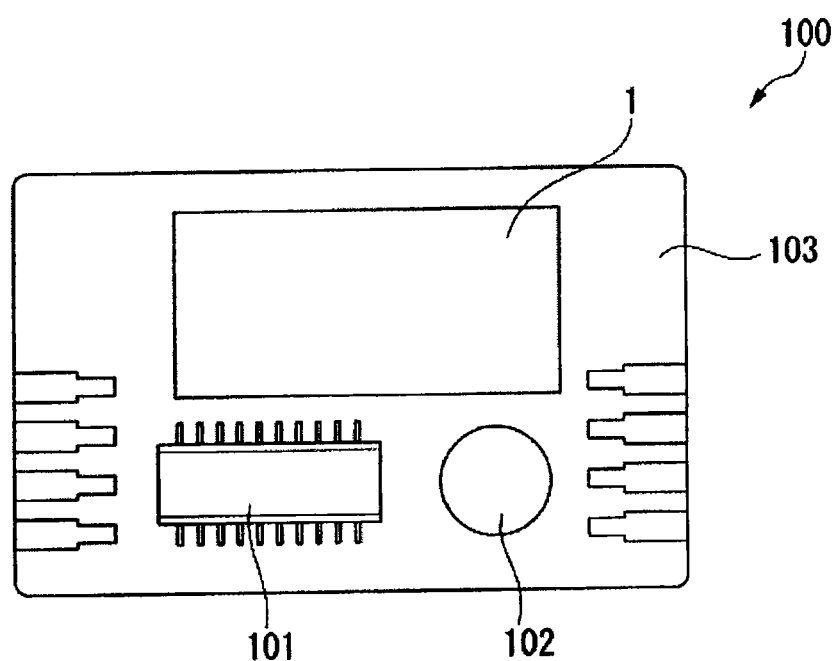
FIG. 6 is a view showing one embodiment of an oscillator of the invention.
Figure 7A:
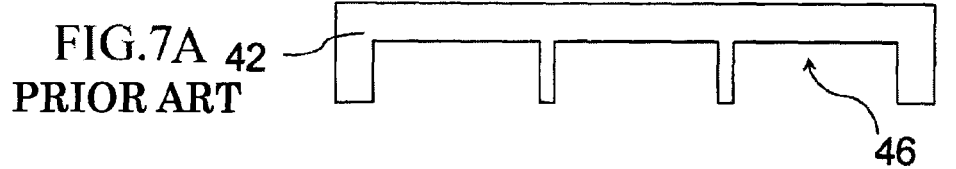
FIG. 7A through FIG. 7E are cross sections of a flowchart depicting a manufacturing method of an electronic device package in the related art.
Figure 7B:
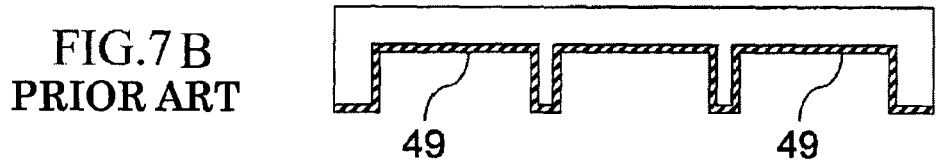
Figure 7C:
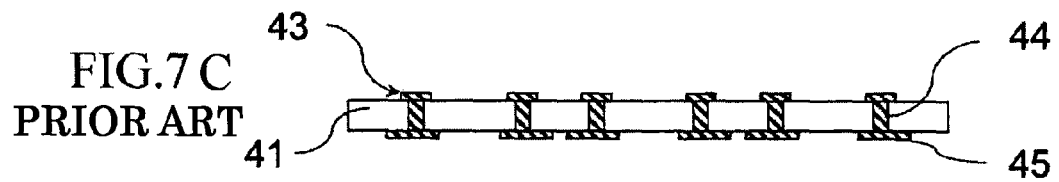
Figure 7D:
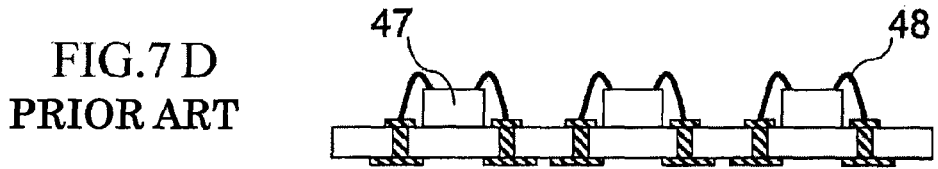
Figure 7E:
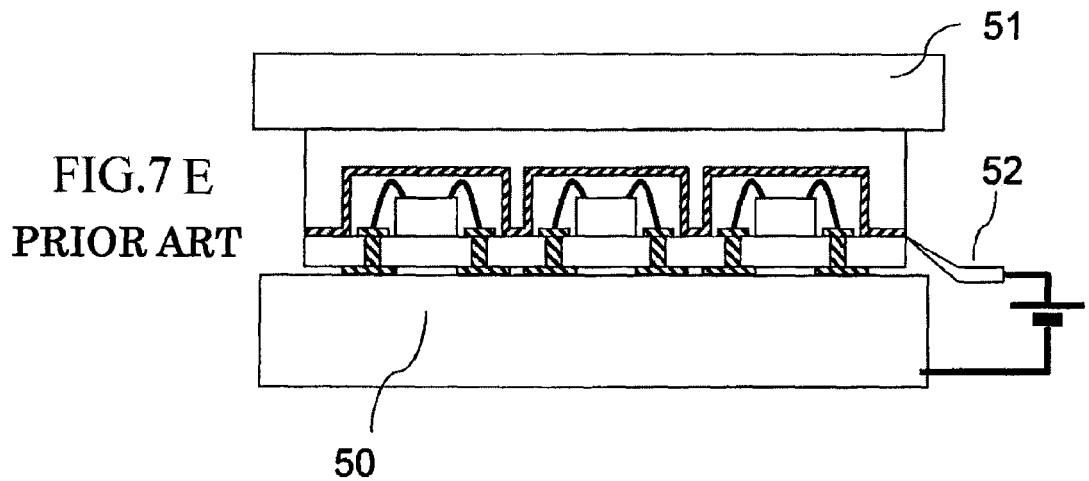

One embodiment of an oscillator of the invention will now be described with reference to FIG. 6. As is shown in FIG. 6, an oscillator 100 of this embodiment includes, as a transducer electrically connected to an integrated circuit 101, the electronic device package 1 (piezoelectric transducer) using a piezoelectric vibrating piece made, for example, of quartz, as the electronic device 4. The oscillator 100 includes a substrate 103 on which an electronic component 102, such as a capacitor, is mounted. The integrated circuit 101 for oscillator is mounted on the substrate 103 and the electronic device package 1 (piezoelectric transducer) is mounted thereon in the vicinity of the integrated circuit 101. The electronic component 102, the integrated circuit 101, and the electronic device package 1 (piezoelectric transducer) are electrically interconnected by an unillustrated wiring pattern. Each component is molded with unillustrated resin.

In the oscillator 100 configured as above, when a voltage is applied to the piezoelectric transducer, the piezoelectric vibrating piece in the piezoelectric transducer vibrates. The vibration is converted to an electric signal by the piezoelectric characteristic of the piezoelectric vibrating piece and inputted into the integrated circuit 101 as the electric signal. The integrated circuit 101 applies various types of processing to the electric signal inputted therein and outputs the resulting signal as a frequency signal. The piezoelectric transducer thus functions as an oscillator. By selectively setting the configuration of the integrated circuit 101 as required, for example, by setting an RTC (Real Time Clock) module, it becomes possible to provide a single-function oscillator for timepiece with an additional function of controlling an operation date or clock time of the oscillator or an outside device or presenting a clock time or a calendar.

What is claimed is:

1. A package for an electronic device comprising: a hermetically closed casing comprising anodically bonded first and second substrates defining a cavity therebetween; a first metal film on an external surface of the first substrate, wherein the first metal film comprises a material having a linear expansion coefficient smaller than that of the first substrate; a second metal film on an inner surface of the first substrate opposite from the external surface and at a bonding interface on the internal surface between the first and second substrates, the second metal film configured to anodically bond the first and second substrates, wherein the second metal film comprises a metallic material different from the first metal film and does not contact the first metal film; and an electronic device secured inside the cavity.

2. The package according to claim 1, wherein the first metal film comprises one of Si, Cr, W and any combination thereof.

3. The package according to claim 2, wherein the first substrate includes a recess to define the cavity.

4. The package according to claim 3, wherein the second metal film covers the entirety of the inner surface of the first substrate including the recess.

5. An oscillator comprising the package defined in claim 4.

6. A clock device comprising the package defined in claim 4.

7. The package according to claim 1, wherein the second film material comprises a material having a linear expansion coefficient larger than that of the first substrate.

8. The package according to claim 1, wherein the second metal film comprises one of Al, Ni, Au, Sn, Cu and any combination thereof.

9. The package according to claim 1, wherein the first and second metal films each have a thickness within a range of about 200 Å to about 2000 Å.

10. The package according to claim 1, wherein the first substrate comprises glass.

11. The package according to claim 1, wherein the electronic device comprises a piezoelectric vibrating reed.

* * * * *